(12) United States Patent
Kim

(10) Patent No.: US 6,333,527 B2
(45) Date of Patent: Dec. 25, 2001

(54) SEMICONDUCTOR DEVICE AND METHOD FOR FABRICATING THE SAME

(75) Inventor: Jae Kap Kim, Kyoungki-do (KR)

(73) Assignee: Hyundai Electronics Industries Co., Ltd., Kyoungki-do (KR)

(*) Notice: Subject to any disclaimer, the term of this patent is extended or adjusted under 35 U.S.C. 154(b) by 0 days.

(21) Appl. No.: 09/867,584

(22) Filed: May 31, 2001

Related U.S. Application Data

(62) Division of application No. 08/773,174, filed on Dec. 27, 1996, now Pat. No. 5,829,851, which is a continuation of application No. 08/468,958, filed on Jun. 6, 1995.

(30) Foreign Application Priority Data

Jun. 8, 1994 (KR) .................................................. 94-12822
Jun. 8, 1994 (KR) .................................................. 94-12823

(51) Int. Cl.[7] .................................................. H01L 29/76
(52) U.S. Cl. .......................... 257/288; 257/369; 438/199
(58) Field of Search ..................................... 257/288, 338, 257/350, 369, 377; 438/197, 199, 202, 227, 229, 592

(56) References Cited

U.S. PATENT DOCUMENTS

| 4,050,965 | * | 9/1977 | Ipri et al. . |
| 5,037,772 | * | 8/1991 | McDonald . |
| 5,089,433 | * | 2/1992 | Anand et al. . |
| 5,223,456 | * | 6/1993 | Malwah . |
| 5,882,965 | * | 3/1999 | Schwalke et al. . |
| 5,956,617 | * | 9/1999 | Kimura et al. . |
| 6,174,775 | * | 1/2001 | Liaw et al. . |

* cited by examiner

Primary Examiner—Tuan H. Nguyen
(74) Attorney, Agent, or Firm—Nath & Associates PLLC; Gary M. Nath; Marvin C. Berkowitz

(57) ABSTRACT

A semiconductor device comprising a dual polysilicon gate structure in which the P type polysilicon gate is connected with the N type polysilicon gate by a bilayer conductive wiring structure without any contact, thereby significantly contributing to high integration, and a method for fabricating the semiconductor device such that the production yield is improved.

2 Claims, 7 Drawing Sheets

SEMICONDUCTOR DEVICE AND METHOD FOR FABRICATING THE SAME

This application is a divisional application of U.S. patent application Ser. No. 08/773,174, filed Dec. 27, 1996, now U.S. Pat. No. 5,829,851 which is a continuation of U.S. patent application Ser. No. 08/468,958, filed Jun. 6, 1995, the entire contents of which are hereby incorporated herein their entirety.

BACKGROUND OF THE INVENTION

1. Field of the Invention

The present invention relates, in general, to a semiconductor device and a method for fabricating the same. Particularly, the present invention relates to a semiconductor device with a bilayer conductive wiring structure and without any contact for interconnecting different types of conductive wirings, thereby contributing to the high integration of a semiconductor device. Also, the present invention is concerned with a method for fabricating the semiconductor device such that the production yield is improved.

2. Description of the Prior Art

High integration of semiconductor devices is necessarily accompanied by complicated conducting wirings, which connect one device with another. The complicated conducting wirings generally form a multilayer structure in which many contacts are formed to interconnect the wirings on each layer with each other, deleteriously affecting the topology of the overall structure of the final semiconductor devices. Such topology gives rise to a decrease in the production yield and acts as a main impediment which inhibits the further integration of semiconductor devices.

High integration of semiconductor devices also forces the channel length of a MOSFET to be shortened. In order to minimize the channel length, p type MOSFETs take advantage of a p type impurity-doped polysilicon gate. For an n type MOSFET an n type impurity-doped polysilicon gate is utilized. In such case, additional connecting lines are prepared in order for one gate line to connect the p type polysilicon with the n type polysilicon. In addition, since the connecting lines are contacted at the boundary region between the polysilicons with different impurity types, the area for the contact must be secured on designing semiconductor devices.

Besides, the different type gate lines can be electrically connected with each other only after carrying out an implantation process of respective impurities two times and a contact process. Consequently, this prior art procedure is complicated and the semiconductor devices obtained by it are difficult to highly integrate because of the large area occupied by the contact regions.

SUMMARY OF THE INVENTION

Accordingly, it is a principal object of the present invention to provide a semiconductor device with a bilayer conductive wiring structure free of the contact for conductive wirings, thereby improving its topology, and a fabrication method therefor.

It is another object of the present invention to provide a semiconductor device with a dual polysilicon gate structure in which the P type polysilicon gate is connected with the N type polysilicon gate by a bilayer conductive wiring structure without any contact, thereby significantly contributing to high integration, and a fabrication method therefor.

It is a further object of the present invention to provide a semiconductor device with a dual polysilicon gate structure in which the P type polysilicon gate is connected with the N type polysilicon gate through selective tungsten or silicide without any contact, thereby significantly contributing to high integration, and a fabrication method therefor.

In accordance with one aspect of the present invention, there is provided a method for forming conductive wirings in a semiconductor device, comprising the steps of: forming a first conductive layer on an insulating layer; forming an etch barrier layer on the first conductive layer; selectively etching the etch barrier layer by use of a first conductive wiring mask, to form an etch barrier layer pattern; forming a second blanket conductive layer over the resulting structure; forming a photosensitive film pattern by use of a second conductive wiring mask with an arrangement to overlap with said etch barrier pattern; etching the second conductive layer by use of a second conductive wiring mask, to form a second conductive wiring; etching the first conductive layer by use of a combination of the photosensitive film pattern and the etch barrier layer pattern as an etch mask, to form a first conductive wiring; and removing the photosensitive film pattern, to obtain a bilayer conductive wiring structure in which the second conductive wiring stacks up on a part of the first conductive wiring.

In accordance with another aspect of the present invention, there is provided a method for fabricating a semiconductor device having a dual polysilicon gate structure, comprising the steps of: forming a P well and an N well in a semiconductor substrate and forming an element isolating film on a predetermined area including the boundary of the P well and the N well; forming a gate oxide film, a first conductive layer and an etch barrier layer, in sequence; etching the etch barrier layer by use of a gate electrode mask consisting of two separate regions, to form an etch barrier layer pattern consisting of two separate regions; depositing a blanket second conductive layer and etching it by use of a second conductive wiring mask, to form a second conductive layer pattern, said second conductive wiring mask being arranged so as to overlap both the two separate regions of the etch barrier layer pattern; etching the first conductive layer by use of a combination of the second conductive wiring mask and the etch barrier layer as an etch mask, to form a first conductive layer pattern; implanting P type impurities into the N well and one part of the first conductive layer pattern by use of a P type ion-implanting mask, to form a P type source/drain electrode and a P type gate electrode, said P type ion-implanting mask being arranged to mask the P well region including the other part of the first conductive layer pattern; and implanting N type impurities into the P well and the other part of the first conductive layer pattern by use of an N type ion-implanting mask, to form an N type source/drain electrode and a N type gate electrode, said N type ion-implanting mask being arranged to mask the N well region including the one part of the first conductive layer pattern.

In accordance with a further aspect of the present invention, there is provided a semiconductor device, comprising: a P well and an adjacent N well in a semiconductor substrate; an element isolating film formed on a predetermined area including the boundary between the P well and the N well; gate oxide layers formed on the P well and the N well; a dual polysilicon gate structure extending from a part of the P well through the element isolating film to a part of the N well; said dual polysilicon gate consisting of a P type gate electrode and an N type gate electrode, which are on the P well region and the N well region, respectively; and a conductive layer formed on the dual polysilicon gate structure and for interconnecting the P type gate electrode and the N type gate electrode.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENT

Figure 1:
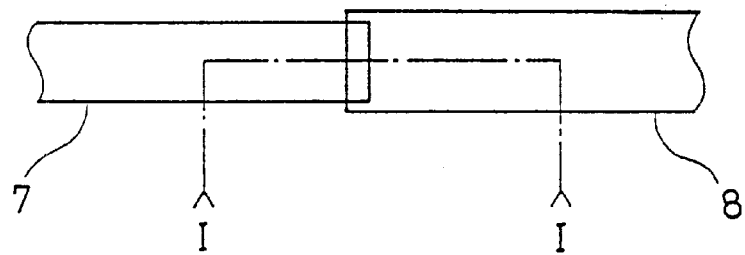
FIG. 1 is a layout showing an arrangement of masks for a bilayer conductive wiring structure according to a first embodiment of the present invention.

The application of the preferred embodiments of the present invention is best understood with reference to the accompanying drawings, wherein like reference numerals are used for like and corresponding parts, respectively.

Referring initially to FIG. 1, there is a layout of conductive wiring masks according to a first embodiment of the present invention. As shown in this layout, a first conductive wiring mask 7 and a second conductive wiring mask 8 are arranged so that they overlap in part with each other.

Figure 2:
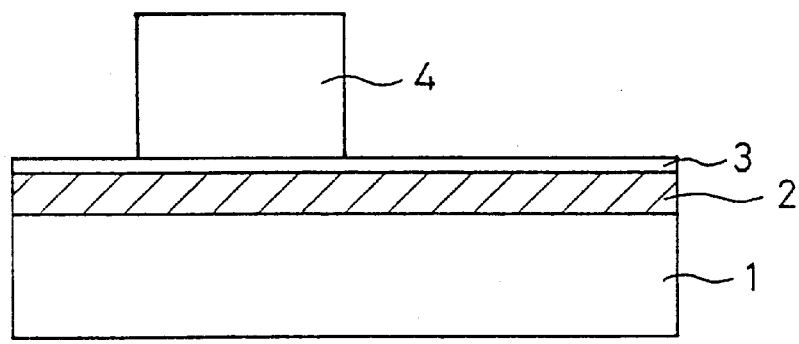
FIGS. 2 to 4 are schematic cross sectional views showing a formation method for a bilayer conductive layer structure, according to the first embodiment of the present invention.
Figure 3:
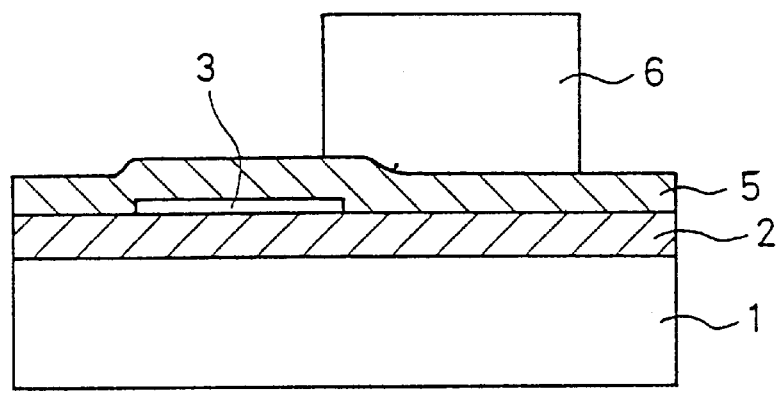
Figure 4:
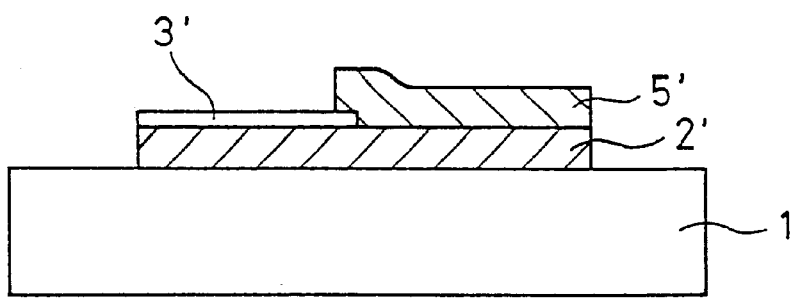

With reference now to FIGS. 2 to 4, preferred process steps for forming conductive wirings are illustrated in cross sectional views taken through the line I—I of FIG. 1.

As shown in FIG. 2, the first embodiment of the present invention starts with the formation of a first conductive layer 2, which is to be a lower conductive wiring, on an insulator 1 such as an interlayer insulating film or a planarization layer. Then, an etch barrier layer 3 is formed on the first conductive layer 2, followed by the formation of a first photosensitive film pattern 4 on a predetermined area of the etch barrier layer 3 using the first conductive wiring mask 7 of FIG. 1. The etch barrier layer is made of a material which shows a large etch selection ratio to a second conductive wiring to be formed later, e.g. an oxide.

With reference now to FIG. 3, the etch barrier layer 3 is selectively etched by using the first photosensitive film pattern 4 as an etch mask to form an etch barrier layer pattern 3', and a blanket second conductive layer 5 is deposited after removing the first photosensitive film pattern 4, followed by the formation of a second photosensitive film pattern 6 on the second conductive layer 5 by use of the second conductive wiring mask 8 of FIG. 1. The second photosensitive film pattern 6 overlaps with the etch barrier layer pattern 3', which is attributed to the overlapping of the second conductive wiring mask 8 with the first conductive wiring mask 7 as shown in FIG. 1. The first conductive layer 2 differs from the second conductive layer 5 in substance. For example, if the first conductive layer 2 is made of silicon, the second conductive layer 5 may be formed of silicide or tungsten. In addition, the first conductive layer 2 may be made of aluminum with the second conductive layer 5 of tungsten or TiN.

FIG. 4 is a cross section after two etching steps are undertaken to form a composite conductive wiring having a bilayer structure at some part and a single layer structure at the other part. In the first etching step the second conductive layer 5 is removed with the second photosensitive film 6 serving as a mask, so as to form a second conductive wiring 5'. The second etching step is carried out is such a way that, while the second photosensitive film pattern 6 and the etch barrier layer pattern 3' serve as a mask, the exposed area of said first conductive layer 2 is removed, to form a first conductive wiring 2'. As a result, a bilayer structure consisting of the first conductive wiring 2' and the second conductive wiring 5' and a monolayer structure consisting exclusively of the first conductive wiring 2' are formed. While the monolayer structure may be used as an ordinary conductive wiring such as relatively high resistant wiring or as a conductive region with poor corrosion and/or abrasion resistance, the bilayer structure may be used as a conductive region with superior corrosion resistance and/or electrical properties.

Figure 5:
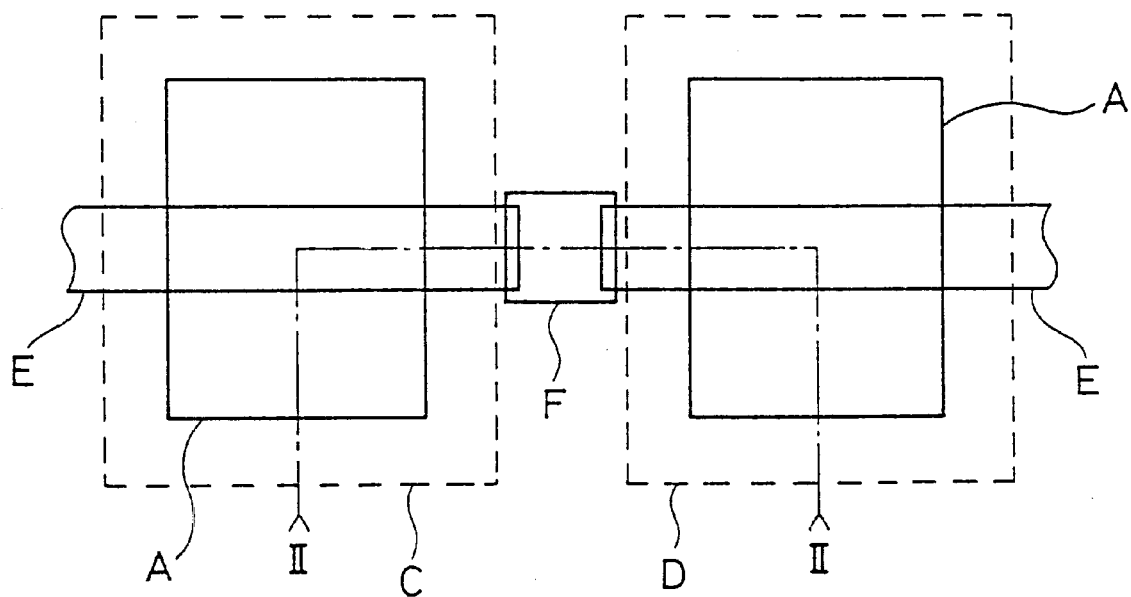
FIG. 5 is a layout showing an arrangement of masks for a semiconductor device having a dual polysilicon gate structure, according to a second embodiment of the present invention.

Referring to FIG. 5, there is a layout of wiring masks for conferring upon a semiconductor device a dual polysilicon gate structure in which a P type polysilicon gate electrically connects with a N type polysilicon gate, according to a second embodiment of the present invention. In this layout, active masks A are regularly spaced apart. For dual polysilicon gate structure, a P type ion-implanting mask C, which is responsible for one active mask A, is arranged beside but separated from an N type ion-implanting mask D which is likewise responsible for another adjacent active mask. A second conductive wiring mask F is between the P type ion-implanting mask C and the N type ion-implantation mask D. A gate electrode mask E runs across each of the ion-implanting masks from one second conductive wiring mask F to another, overlapping the second conductive wiring mask F.

FIGS. 6 through 9 are cross sectional views illustrating preferred process steps for fabricating a semiconductor device having a dual polysilicon gate structure of P type and N type polysilicon gate, taken through the line II—II of FIG. 5.

Figure 6:
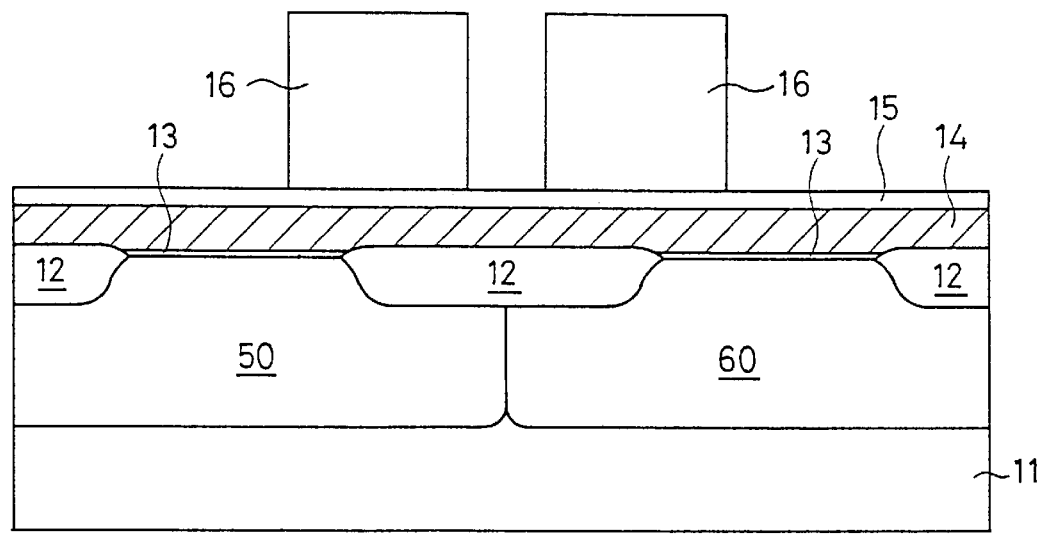
FIGS. 6 to 9 are schematic cross sectional views showing a fabrication method for a semiconductor device having a dual polysilicon gate structure in which the P type polysilicon gate is electrically connected with the N type polysilicon gate without contact, according to the second embodiment of the present invention.

With reference now to FIG. 6, to begin with, an N well 50 and a P well 60 are formed in a semiconductor substrate 11 and, on a predetermined element-isolating region centering around the boundary between the N well 50 and the P well 60, an element insulating film 12 is formed by an oxidizing technique using the active mask A of FIG. 5. Thereafter, a gate oxide film 13 is formed on the exposed area of the semiconductor substrate, followed by the formation of a blanket first conductive layer 14 on the resulting structure and then by the formation of a blanket etch barrier layer 15 on the conductive layer 14. It is preferred that the first conductive layer 14 is made of silicon with a polycrystalline or amorphous crystal structure and the etch barrier layer 15 is of an oxide. After coating a thick photosensitive film on the etch barrier layer 15, a light exposure process taking advantage of the gate electrode mask E of FIG. 5 and then a development process are carried out to form first photosensitive film patterns 16.

Figure 7:
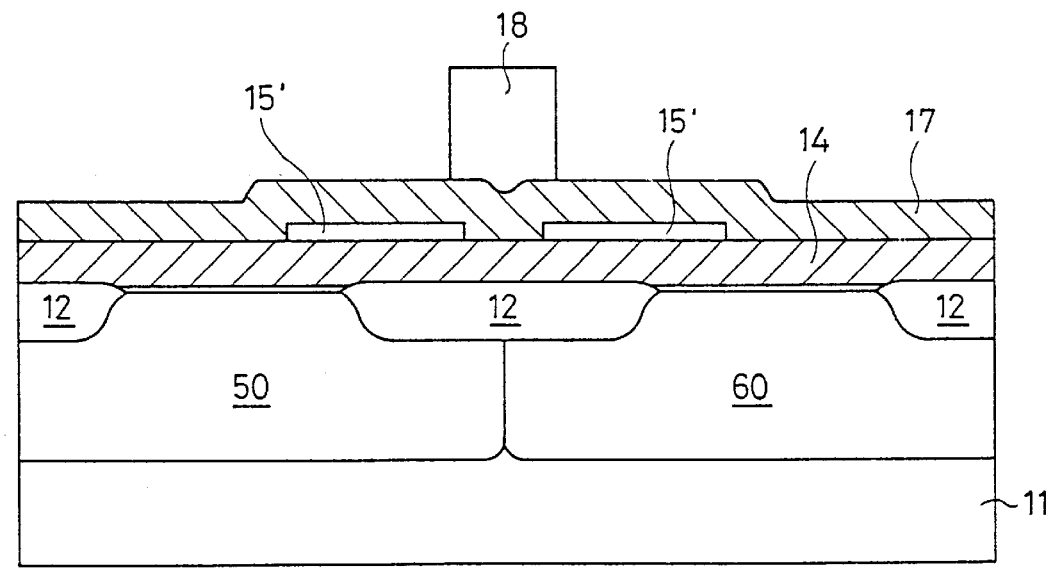

With reference to FIG. 7, the etch barrier layer 15 is selectively etched by using the first photosensitive film patterns 16 as an etch mask, to form etch barrier layer patterns 15', each being some distance from the line joining the boundary between the wells, and a blanket second conductive layer 17 is deposited after removing the first photosensitive film patterns 16. After being coated on the second conductive layer 17, a thick second photosensitive film is exposed to light under the second conductive wiring mask F of FIG. 5 and then developed into a second photosensitive film pattern 18. The second photosensitive film pattern 18 overlaps with both of the etch barrier layer patterns 15', which is attributed to the overlapping of the second conductive wiring mask F with the first conductive wiring mask E as shown in FIG. 5.

Figure 8:
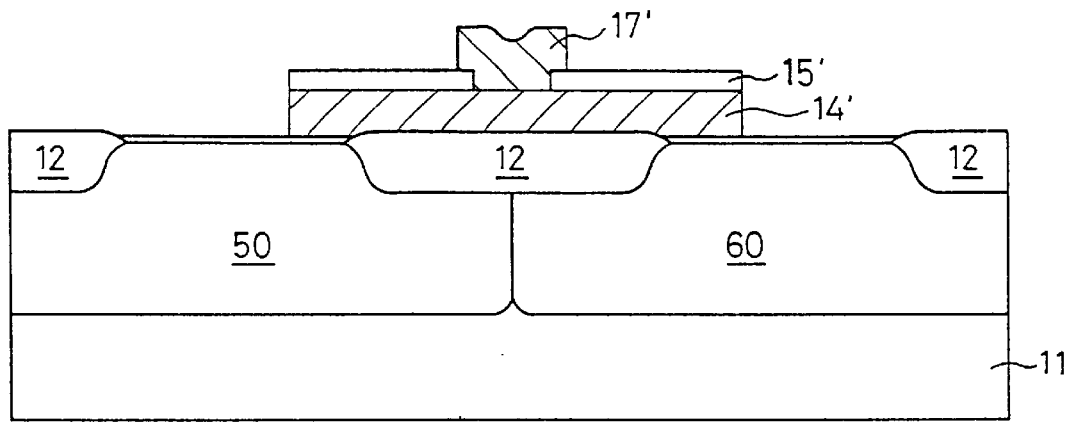

FIG. 8 is a cross section after two etching steps are undertaken to form a composite conductive wiring having a bilayer structure at some part and a single layer structure at the other part. In the first etching step the second conductive layer 17 is removed with the second photosensitive film 18 serving as a mask, so as to form a second conductive wiring 17'. The second etching step is carried out in such a way that, while the second photosensitive film pattern 18 and the etch barrier layer pattern 15" serve as a mask, the exposed area of said first conductive layer 14 is removed, to form a first conductive wiring'. As a result, a bipartite conductive wiring structure consisting of the first conductive wiring 14' and the second conductive wiring 17' is obtained. In practice, the first conductive wiring 17 extends from one element isolating film to another, as apparent from the gate electrode mask E of FIG. 5.

Figure 9:
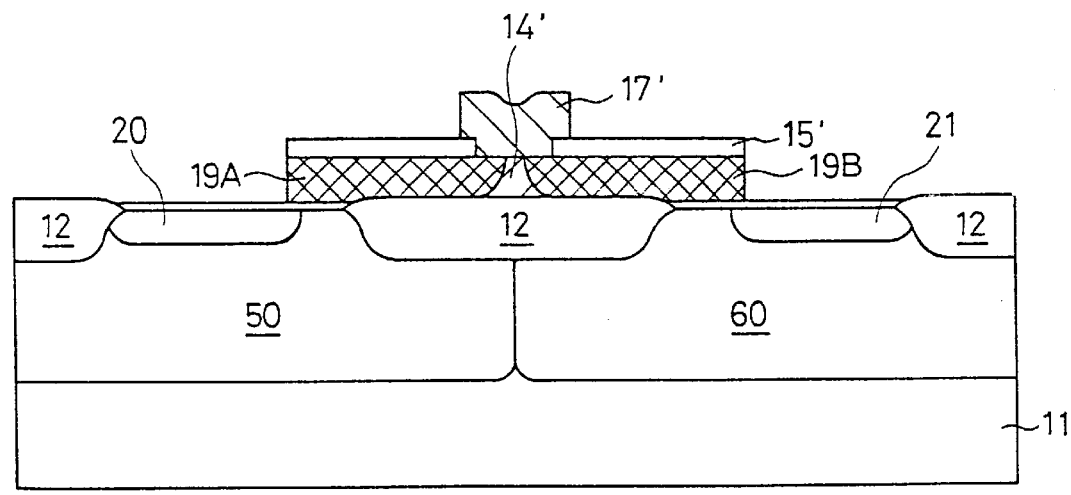

FIG. 9 is a cross section after P type MOSFET and N type MOSFET are formed along with a dual polysilicon gate structure. Two impurity-implanting processes are carried out for the MOSFETs. In the first impurity-implanting process a high concentration of P type impurity, for example, boron ion, is doped in the N well 50 and one side of the first conductive wiring 14'by use of the P type ion-implanting mask C of FIG. 5, so as to form a P type source/drain electrode 20 and a P type gate electrode 19A, respectively. The second impurity-implanting process is like the first. That is, using the N type ion-implanting mask D of FIG. 5, a high concentration of N type impurities, for example, arsenic ions, is implanted in the P well 60 and the other side of the first conductive wiring 14', to form an N type source/drain electrode 21 and an N type gate electrode 19B, respectively. An electrical connection between the N type gate electrode 19B and the P type gate electrode 19A is achieved by the second conductive wiring 17'.

Figure 10:
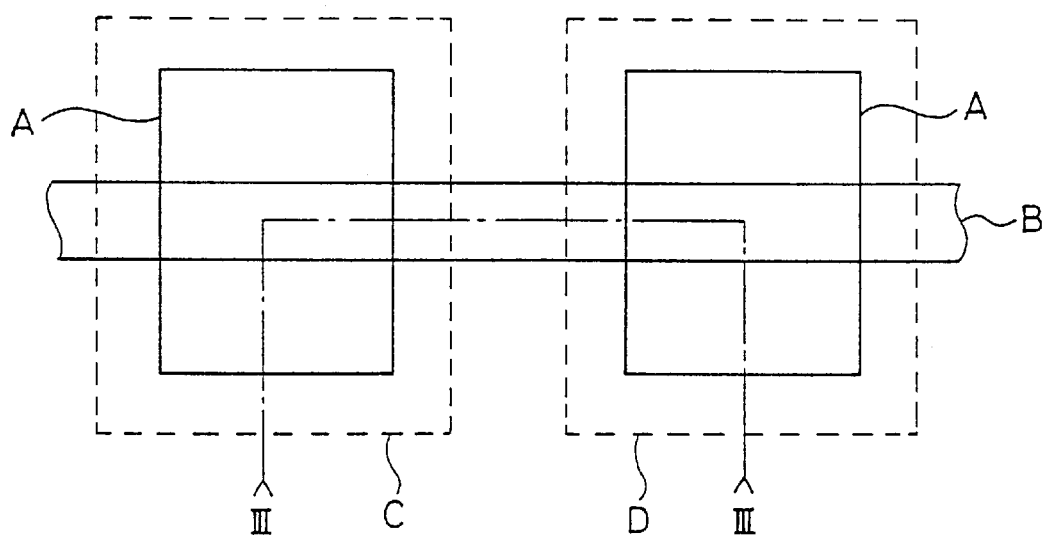
FIG. 10 is a layout showing an arrangement of masks for a semiconductor device having a dual polysilicon gate structure, according to a third embodiment of the present invention.

Referring to FIG. 10, there is a layout of wiring masks for conferring upon a semiconductor device a dual polysilicon gate structure in which a P type polysilicon gate electrically connects with an N type polysilicon gate, according to a third embodiment of the present invention. In this layout, rectangular active masks A are regularly spaced apart. A gate electrode mask B runs across the active masks A and extends further. For dual polysilicon gate structure, a P type ion-implanting mask C responsible for one active mask A is arranged beside but separated from an N type ion-implanting mask D which is likewise responsible for another adjacent active mask.

FIGS. 11 through 15 are cross sectional views illustrating preferred process steps for fabricating a semiconductor device having a dual polysilicon gate structure of P type and N type polysilicon gates, taken through the line III—III of FIG. 10.

Figure 11:
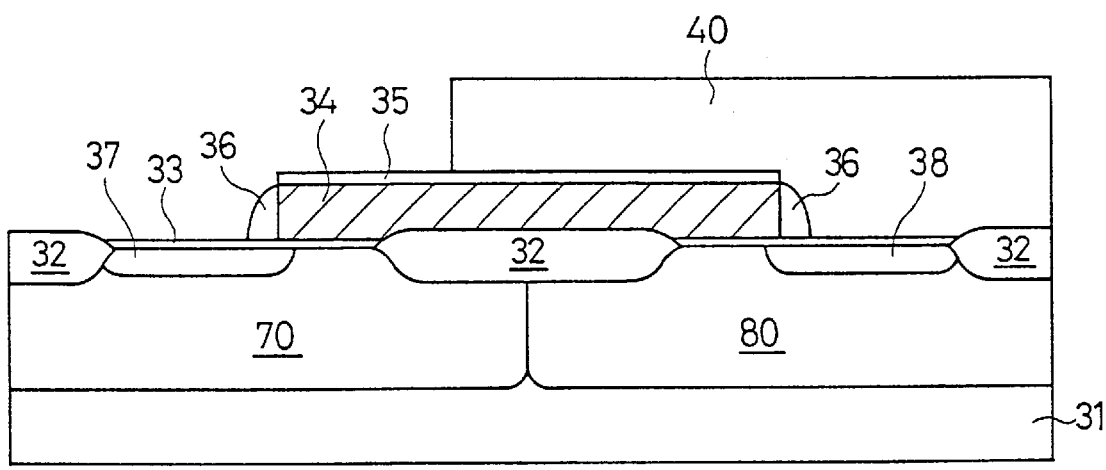
FIGS. 11 to 15 are schematic cross sectional views showing a fabrication method for a semiconductor device having a dual polysilicon gate structure in which the P type polysilicon gate is electrically connected with the N type polysilicon gate without contact, according to the third embodiment of the present invention.

With reference now to FIG. 11, a dual polysilicon structure starts with the formation of an N well 70 and a P well 80 in a semiconductor substrate 31 and, on a predetermined element-isolating region centering around the boundary between the N well 70 and the P well 80, an element insulating film 32 is formed by an oxidizing technique using the active mask A of FIG. 10. Thereafter, a gate oxide film 33 is formed on the exposed area of the semiconductor substrate 31, followed by the formation of a blanket first conductive layer on the resulting structure and then, by the formation of a blanket oxidation barrier layer on the first conductive layer. Using the gate electrode mask B of FIG. 10, the oxidation barrier layer and the conductive layer are etched to form an oxidation barrier layer pattern 35 and a gate electrode 34. It is preferred that the oxidation barrier layer is made of a nitride.

Then, a low concentration of impurities is implanted into the N well 70 and the P well, to form lightly doped drains 37 and 38. The gate electrode 34 is flanked by an insulating film spacer 36. A thick blanket photosensitive film is formed upon the resulting structure and subjected to light exposure and development under the influence of the P type ion-implanting mask C of FIG. 10, so as to form a first photosensitive film pattern 40, that covers the P well region including a part of the oxidation barrier layer 35 but exposes the N well region including the other part of the oxidation barrier layer 35.

Figure 12:
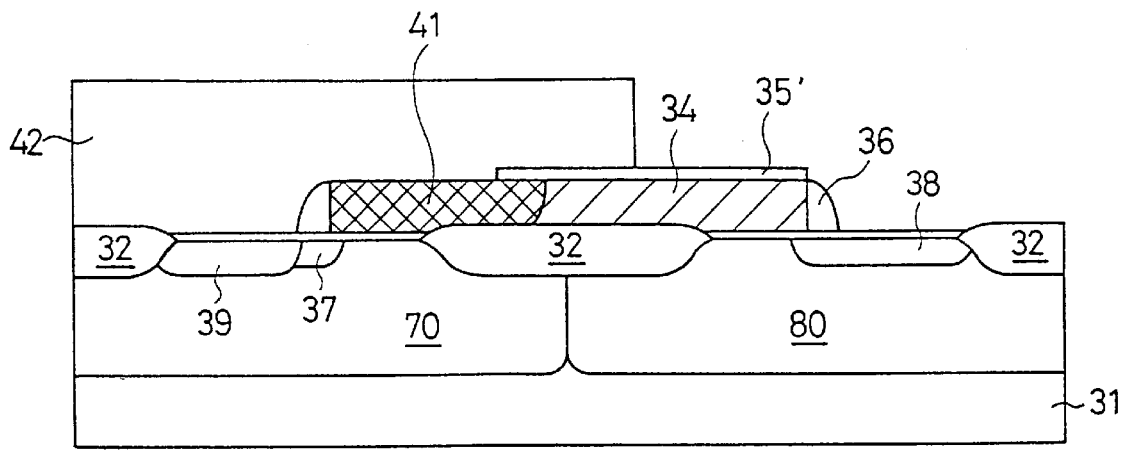

Turning now to FIG. 12, the exposed part of the oxidation barrier layer 35 is removed by etch to form a first oxidation barrier layer pattern 35', exposing a part of the gate electrode 34, and a high concentration of P type impurities, for example, boron ions, is implanted in the exposed part of the gate electrode 34 and the N well 70 to form a P type gate electrode 41 and a P type source/drain electrode 39. Following removal of the first photosensitive film pattern 40, a fresh, thick blanket photosensitive film is coated upon the resulting structure. Likewise, it is exposed to light under the N type ion-implanting mask D of FIG. 10 and then developed into a second photosensitive film pattern 42, that covers the N well region including a part of the first oxidation barrier layer pattern 35' but exposes the P well region including the other part of the first oxidation barrier layer pattern 35'.

Figure 13:
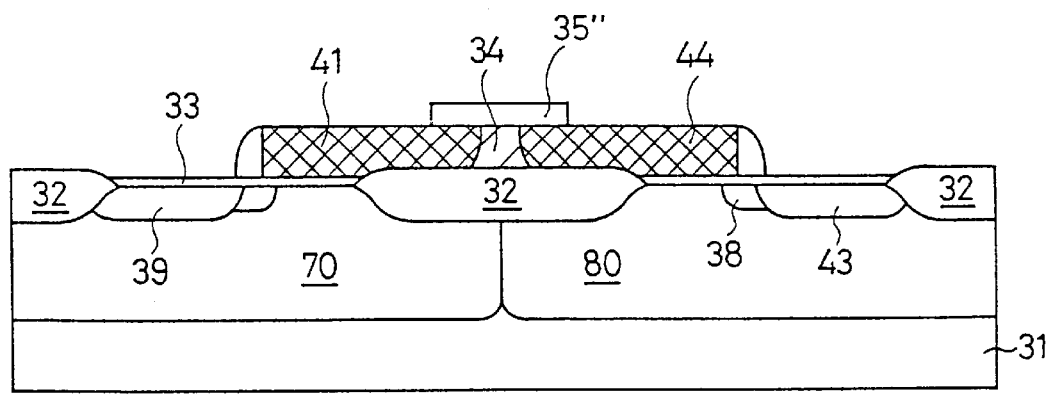

Referring to FIG. 13, the exposed part of the first oxidation barrier layer pattern 35' is removed by etch to form a second oxidation barrier layer pattern 35", exposing a part of the gate electrode 34, and a high concentration of N type impurities, for example, phosphorous ions, is implanted in the exposed part of the gate electrode 34 and the P well 80 to form a N type gate electrode 44 and an N type source/drain electrode 43. The second photosensitive film pattern 42 is removed. As shown in this figure, the second oxidation barrier pattern 35" is approximately centered on the gate electrode 34 and thus overlaps with both the P type gate electrode 41 and the N type gate electrode 44.

Figure 14:
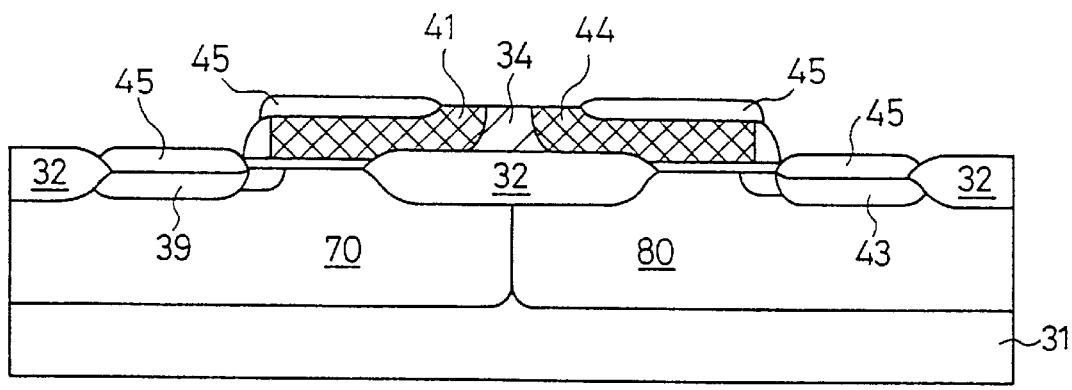

FIG. 14 is a cross section after a thermal oxide layer 45 with a thickness of about 200 to 700 Angstrom growing on the exposed part of the gate electrode and the well regions of the semiconductor substrate 31, followed by the removal of the second oxidation barrier layer 35". The thermal oxide layer 45 is obtained by carrying out a thermal oxidation process using the second oxidation barrier layer pattern 35" as a mask.

Figure 15:
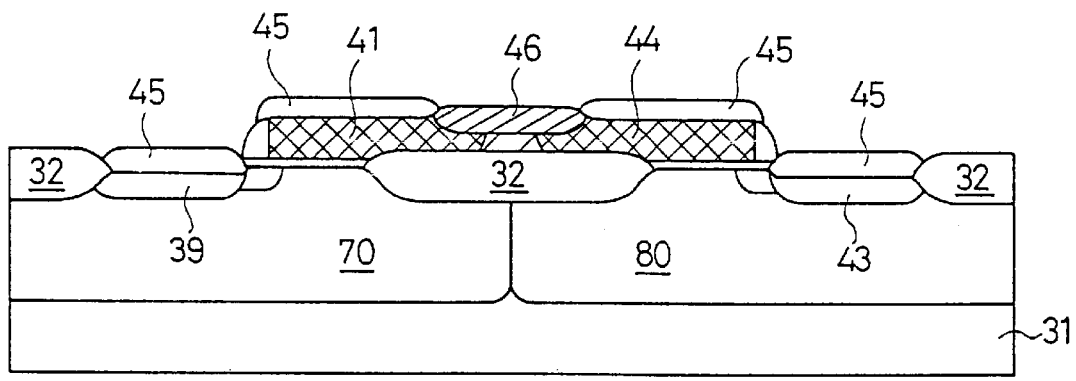

FIG. 15 is a cross section after conductive layer 46 is formed on the central area of the gate electrode, the exposed part that results from the removal of the second oxidation barrier layer pattern 35" overlapping with the P type gate electrode 41 and N type gate electrode 44, to interconnect the P type gate electrode 41 with the N type gate electrode 44. The second conductive layer 46 can be formed by several typical processes. For example, it can be formed by growing selective tungsten only on the gate electrode made of polysilicon into a thickness of 500 to 1,500 Angstrom. Another typical process comprises depositing a metallic material, such as titanium, on the entire surface, annealing it to form a silicide layer ranging, in thickness, from 300 to 1,000 Angstrom on the exposed area of the gate electrode and subjecting the remaining metallic material to wet etch, for example, by a mixture solution of $NH_4OH/H_2O_2/H_2O$. In addition, a lithographic process can be useful after a conductive layer is formed over the resulting structure.

As described hereinbefore, the methods according to the first and the second embodiments of the present invention are to achieve the formation of a P-MOSFET and an N-MOSFET and the electrical connection of the P type and the N type polysilicon gate in a dual polysilicon gate structure, simultaneously, and thus, they do not require and contact process in addition to being simple, thereby improving production yield. Besides, the absence of contact significantly contributes to a high integration of this device.

According to the third embodiment of the present invention; the P type gate electrode and the N type gate electrode of a dual polysilicon gate electrode structure are interconnected through a conductive layer formed over it. Hence, no contact area is required, improving the high integration of this device. The procedure becomes simpler with an increase in the production yield.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A semiconductor device, comprising:
   a P well and an adjacent N well in a semiconductor substrate;
   an element isolating film formed on a predetermined area including the boundary between the P well and the N well;
   gate oxide layers formed on the P well and the N well;
   a dual polysilicon gate structure extending from a part of the P well through the element isolating film to a part of the N well, said dual polysilicon gate consisting of a P type gate electrode and an N type gate electrode, which are on the P well region and the N well region, respectively; and
   a conductive layer formed on the dual polysilicon gate structure and for interconnecting the P type gate electrode and the N type gate electrode.

2. A semiconductor device in accordance with claim 1, wherein said conductive layer is formed of selective tungsten or Ti silicide.

* * * * *

UNITED STATES PATENT AND TRADEMARK OFFICE
CERTIFICATE OF CORRECTION

| | | |
|---|---|---|
| PATENT NO. | : 6,333,527 B2 | Page 1 of 1 |
| APPLICATION NO. | : 09/867584 | |
| DATED | : December 25, 2001 | |
| INVENTOR(S) | : Jae Kap Kim | |

It is certified that error appears in the above-identified patent and that said Letters Patent is hereby corrected as shown below:

Title Page, Item (62)
In the "Related U.S. Application Data" section:
    Delete "Pat. No. 5,829,951" and insert therefor --Pat. No. 6,261,882--

In claim 1, column 8, line 23:
    Delete "P well region and the N well region" and insert therefor --N well region and the P well region--

Signed and Sealed this

Sixth Day of December, 2011

David J. Kappos
*Director of the United States Patent and Trademark Office*